(12) United States Patent
Kitahara (10) Patent No.: US 6,318,911 B1
(45) Date of Patent: Nov. 20, 2001

(54) GATED CLOCK DESIGN SUPPORTING METHOD, GATED CLOCK DESIGN SUPPORTING APPARATUS, AND COMPUTER READABLE MEMORY STORING GATED CLOCK DESIGN SUPPORTING PROGRAM

(75) Inventor: Takeshi Kitahara, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/052,363

(22) Filed: Mar. 31, 1998

(30) Foreign Application Priority Data

Apr. 1, 1997 (JP) .................................................. 9-083031

(51) Int. Cl.$^7$ ........................................................ G06F 17/50
(52) U.S. Cl. ........................................................... 395/500.07
(58) Field of Search .................................... 364/488, 489, 364/490, 491, 468.28, 900; 395/500.07, 500.08, 500.1, 500.11, 500.03, 500.02, 500.09, 500.12, 500.13, 500.4

(56) References Cited

U.S. PATENT DOCUMENTS

| | | | |
|---|---|---|---|
| 4,813,013 | * | 3/1989 | Dunn .................................... 364/900 |
| 5,365,463 | * | 11/1994 | Donath et al. ....................... 364/578 |
| 5,644,499 | * | 7/1997 | Ishii ..................................... 364/489 |
| 5,825,658 | * | 10/1998 | Ginetti et al. ........................ 364/488 |
| 5,831,866 | * | 11/1998 | Burgun et al. ....................... 364/488 |
| 5,859,776 | * | 1/1999 | Sato et al. ........................ 364/468.28 |
| 5,864,487 | * | 1/1999 | Merryman et al. .................. 364/491 |
| 5,923,564 | * | 7/1999 | Jones et al. .......................... 364/489 |

OTHER PUBLICATIONS

Benini et al. "Saving Power by Synthesizing Gated Clocks for Sequential Circuits," IEEE Design and Test of Computers, vol. 11, Issue 4, p. 32–41, Dec. 1994.*
Beier et al. "A Comparison of 7 Different Volumetry Methods of Left and Right Ventricel Using Post–Mortem Phantoms," Proceedings of Computers in Cardiology, p. 33–36, Sep. 1993.*
Benini and DeMicheli "Automatic Synthesis of Low–Power Gated–Clock Finite–State Machines," IEEE Transactions on Computer–Aided Design of Integrated Circuits and Systems, vol. 15, No.6, p. 630–643, Jun. 1996.*
Proceedings of the ASP–DAC '98, "*A Clock–Gating Method for Low–Power LSI Design*"; T. Kitahara et al.; Feb. 10, 1998, pp. 307–312.

\* cited by examiner

Primary Examiner—Kevin J. Teska
Assistant Examiner—Leigh Marie Garbowski
(74) Attorney, Agent, or Firm—Foley & Lardner

(57) ABSTRACT

Information about logic circuit not clock-gated, information about enable logic for controlling clock output and information about a gating circuit are inputted through circuit information I/O portion. Enable logic timing constraint generating portion generates timing constraint to be secured for enable logic. Enable logic timing determination portion calculates a delay time in the enable logic and determines whether or not the enable logic satisfies the timing constraint based on the delay time. Clock gating execution portion, when the enable logic satisfies the timing constraint, adds a gating circuit and a circuit composed of the enable logic to a logic circuit not clock-gated so as to generate a clock-gated logic circuit. Circuit information I/O portion outputs information about the clock-gated logic circuit and timing constraint to be secured for the enable logic.

20 Claims, 10 Drawing Sheets

< EN_INFO >
< ENABLE >
    T1=AND (I0, I1);
 [EN]=OR (T1, I2);

ENABLE INFORMATION 1
  ENABLE LOGIC :

TARGET FLIP-FLOP :
    FF0, FF1, ···, FF15
  GATING METHOD 1

ENABLE INFORMATION 2
  ENABLE LOGIC :

TARGET FLIP-FLOP :
    FF16, FF17, ···, FF31
  GATING METHOD 2

CLOCK LINE INFORMATION 1
  CLOCK SIGNAL : CLK
    GATE : G4
      FLIP-FLOP : FF0, ⋯ FF15

CLOCK LINE INFORMATION 2
  CLOCK SIGNAL : CLK
    GATE : G6
      FLIP-FLOP : FF16, ⋯ FF31

FIG. 14

ENABLE INFORMATION 1:
  ENABLE LOGIC :
    R1 ——— ENABLE LOGIC OUTPUT
  TARGET FLIP-FLOP :
    FF0, FF1,⋯ , FF31
  GATING METHOD 1

FIG. 15

GATING INFORMATION 1
  ENABLE LOGIC OUTPUT
  CLOCK SIGNAL
  GATED CLOCK SIGNAL

```
CLOCK LINE INFORMATION 1
    CLOCK SIGNAL : CLK
         GATE : G0
   FLIP-FLOP : FF0, FF1, ⋯ FF31
```

GATED CLOCK DESIGN SUPPORTING METHOD, GATED CLOCK DESIGN SUPPORTING APPARATUS, AND COMPUTER READABLE MEMORY STORING GATED CLOCK DESIGN SUPPORTING PROGRAM

BACKGROUND OF THE INVENTION

1. Field of the Invention

This invention relates to automation of logic circuit design using a computer and particularly to a gated clock design supporting system intended to reduce load of procedure for clock gating in the design of a gated clock.

2. Description of the Related Art

Recently, semiconductor chips like LSI have tended to be highly integrated and enlarged, so that power consumption also has simultaneously increased. The gated clock design method has been developed to generate a logic circuit having a small power consumption.

Here, the aforementioned gated clock deign will be described simply. In a subsequent description, the changing of the logic circuit by the gated clock design is referred to as clock gating.

Figure 1:
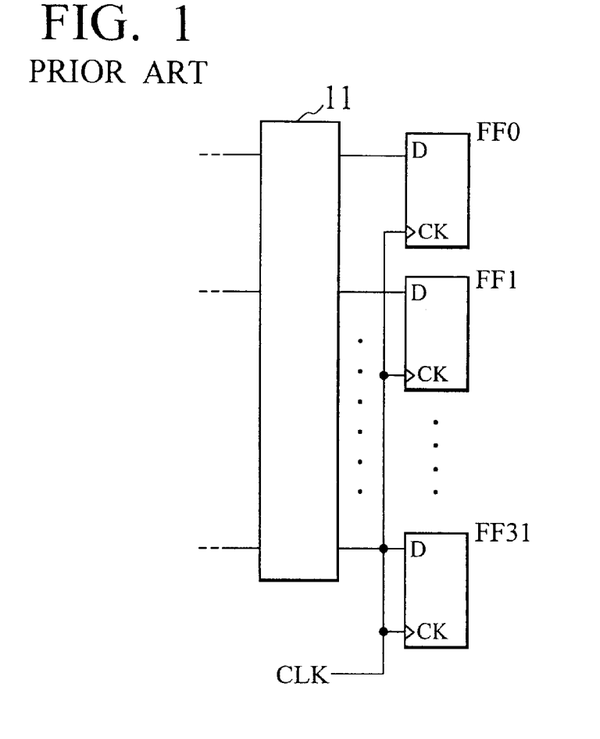
FIG. 1 is a partial circuit diagram showing a part of a synchronous logic circuit to be subjected to logical design.

FIG. 1 is a partial circuit diagram showing a part of a synchronous logic circuit to be subjected to logic design, indicating a logic circuit not clock-gated. In the same Figure, FF0, FF1, ... FF31 indicate D flip-flops and a 32-bit register is formed of 32 flip-flops. A clock signal is supplied to clock input port (CK) of each flip-flop at the same timing and data calculated in data operating circuit 11 is written through data input port D at the same timing as the rise of the clock signal. It has been known that in such a logic circuit, a large amount of power is consumed when the flip-flop is actuated at a rise and fall of the clock. However, because the clock signal is inputted to the flip-flop always at a constant time frame, wasted power is wasted when data fetch is not required.

Figure 2:
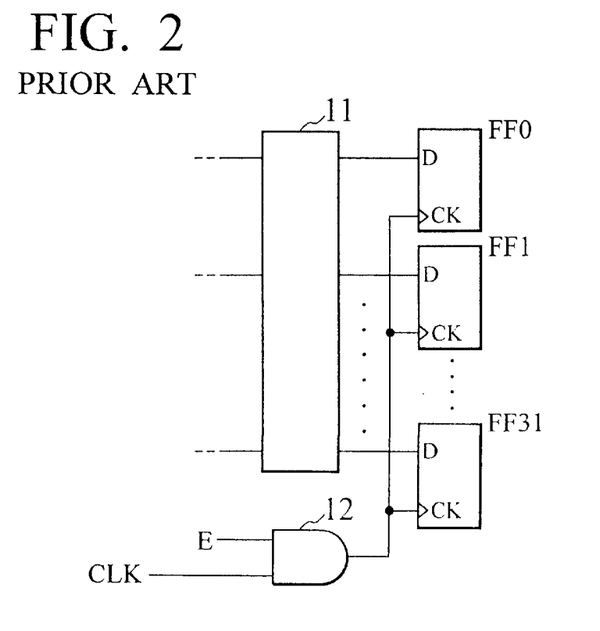
FIG. 2 is a circuit structure diagram of a clock-gated logic circuit.

FIG. 2 is a circuit structure diagram of a clock-gated logic circuit, indicating an example in which an AND gate 12 is inserted on a clock line of FIG. 1 as a gating circuit. An enable logic circuit (not shown) for controlling clock output is connected to this AND gate 12, so that enable logic output of "1" or "0" is supplied from the enable logic circuit to the AND gate 12 corresponding to a timing of the clock signal.

In FIG. 2, when the enable logic output is set to "1", data write is carried out because AND is established when the clock signal rises. On the other hand, if the enable logic output is set to "0", data write is not carried out because AND is not established even if the clock signal rises. When data write is not required, it is possible to prevent consumption of waste power at the flip-flops by making enable logic output to be "0" corresponding to clock timing.

In the aforementioned gated clock design, enable logic circuit for clock gating must be added to the logic circuit at a logical design stage. However, according to the prior art, addition and correction of description in an enable logic circuit in a net list describing a composition of the logic circuit are carried out manually by a designer. Thus, it takes much labor and time when the list is modified and there is a fear that a correction error may occur. Further, for an added enable logic circuit to operate normally in a logic circuit, an enable logic portion needs to satisfy an independent timing constraint different from a data transfer portion. However, this timing constraint differs depending on a method for clock gating, for example, which of the AND gate or OR gate is used in the gating circuit. Therefore, the designer must produce a complicated timing constraint to be supplied to a design supporting CAD.

As described above, in the prior art gated clock design, it takes much labor and time for correction of a list or calculation for timing constraint when an enable logic circuit is added. Further, if a correction error or calculation error occurs, the same work must be repeated, so that it takes further time.

SUMMARY OF THE INVENTION

Accordingly, an object of the present invention is to automate various procedures of gated clock design so as to largely reduce a design period.

To achieve the above object, there is provided a gated clock design supporting method comprising the steps of: inputting information about logic circuit not clock-gated, information about enable logic for controlling clock output and information about a gating circuit; generating timing constraint to be supplied to the enable logic; calculating a delay time in the enable logic; determining whether or not the enable logic satisfies the timing constraint based on the delay time; when the enable logic satisfies the timing constraint, adding the gating circuit and a circuit composed of the enable logic to the logic circuit not clock-gated so as to generate a clock-gated logic circuit; and outputting information about the clock-gated logic circuit and the timing constraint to be secured for the enable logic.

According to a preferred embodiment of the present invention, the gating circuit includes a circuit for securing normal operation of a logic circuit.

According to another embodiment of the present, a step of generating information about gate on clock line of the clock-gated logic circuit is further contained.

According to still another embodiment of the invention, when the enable logic does not satisfy the timing constraint, an error message saying that a timing constraint error has occurred relating to an enable logic portion which does not satisfy the timing constraint is outputted.

According to further embodiment of the present invention, information about the clock-gated logic circuit and the timing constraint to be secured for the enable logic are displayed on a display unit.

According to still further embodiment of the present invention, information about the logic circuit not clock-gated, information about the enable logic and information about the gating circuit are inputted in the form of text information through a key board.

According to still further embodiment of the present invention, information about the logic circuit not clock-gated is inputted by drawing on a screen of a display unit.

Further, to achieve the above object, there is provided a gated clock design supporting apparatus comprising: a circuit information input portion for inputting information about logic circuit not clock-gated, information about enable logic for controlling clock output and information about a gating circuit; an enable logic timing constraint generating portion for generating timing constraint to be secured for the enable logic; an enable logic timing determination portion for calculating a delay time in the enable logic and determining whether or not the enable logic satisfies the timing constraint based on the delay time; a clock gating execution portion for, when the enable logic satisfies the timing constraint, adding the gating circuit and a circuit composed of the enable logic to the logic circuit not clock-gated so as to generate a clock-gated logic circuit; and a circuit information output portion for outputting information about the clock-gated logic circuit and the timing constraint to be secured for the enable logic.

Further to achieve the above object, there is provided a computer-readable memory storing gated clock design supporting program, the gated clock design supporting program comprising the steps of: inputting information about logic circuit not clock-gated, information about enable logic for controlling clock output and information about a gating circuit; generating timing constraint to be secured for the enable logic; calculating a delay time in the enable logic; determining whether or not the enable logic satisfies the timing constraint based on the delay time; when the enable logic satisfies the timing constraint, adding the gating circuit and a circuit composed of the enable logic to the logic circuit not clock-gated so as to generate a clock-gated logic circuit; and outputting information about the clock-gated logic circuit and the timing constraint to be secured for the enable logic.

The nature, principle and utility of the invention will become more apparent from the following detailed description when read in conjunction with the accompanying drawings.

DESCRIPTION OF THE PREFERRED EMBODIMENT

Hereinafter, an embodiment of gated clock design supporting method, gated clock design supporting apparatus and a computer readable memory storing a gated clock design supporting program will be described.

Figure 3:
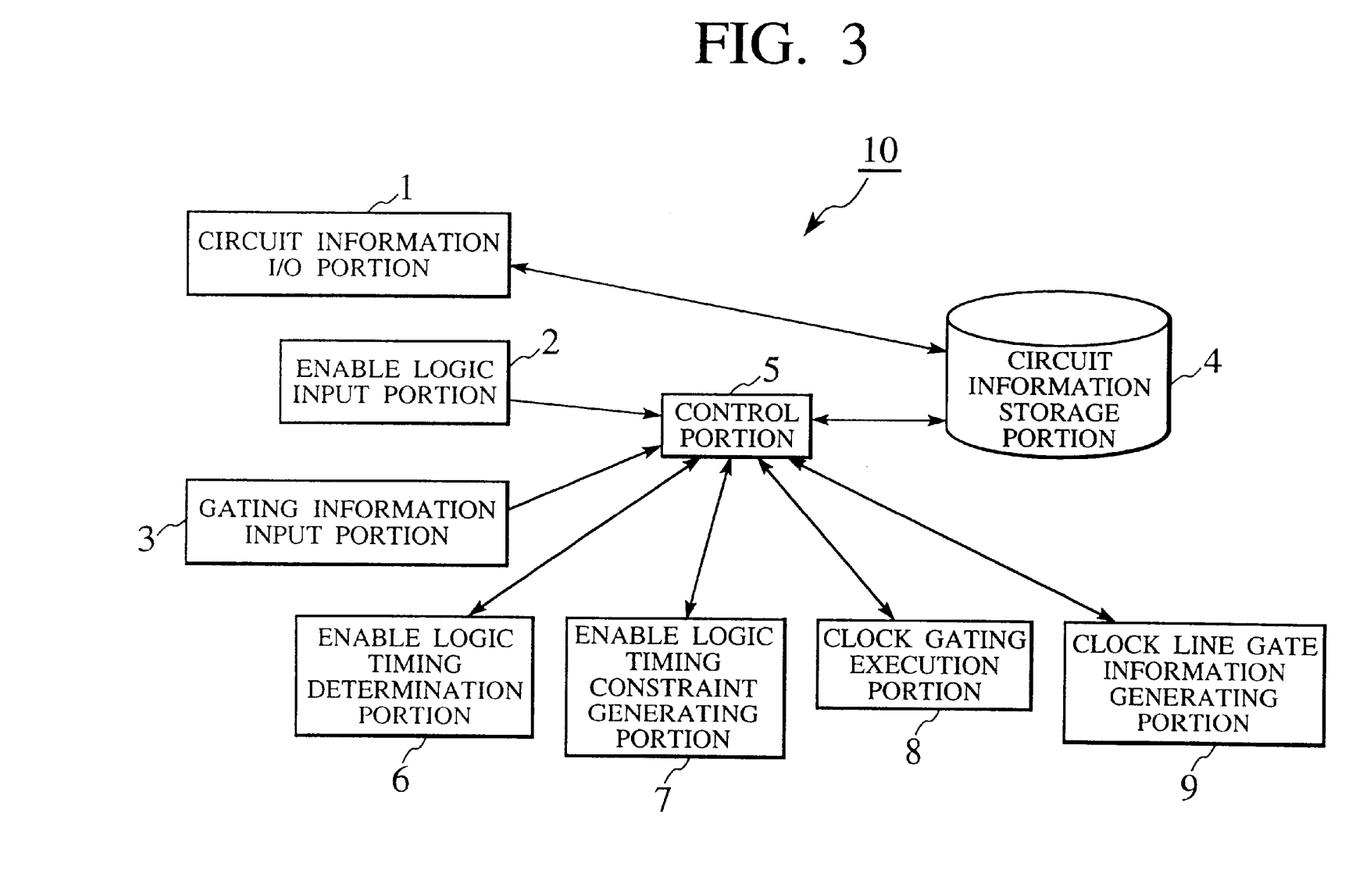
FIG. 3 is a block diagram showing a functional composition of a gated clock design supporting system according to an embodiment of the present invention.

FIG. 3 is a block diagram showing a functional structure of a gated clock design supporting system according to the present embodiment. A gated clock design supporting system 10 shown in FIG. 3 includes a circuit information I/O portion 1, an enable logic input portion 2, a gating information input portion 3, a circuit information storage portion 4, a control portion 5, an enable logic timing determination portion 6, an enable logic timing constraint generating portion 7, a clock gating execution portion 8 and a clock line gate information generating portion 9.

The circuit information I/O portion 1 receives circuit information about logic circuit not clock-gated and then stores this information in the circuit information storage portion 4. Further, the circuit information I/O portion fetches clock-gated circuit information and timing constraint related to enable logic out of the circuit information storage portion 4 and outputs them.

The enable logic input portion 2 inputs enable logic in which circuit structure of an enable logic circuit for controlling clock output is described to the control portion 5 together with flip-flop name (e.g., FF0, FF1 . . . , etc.) subjected to the enable logic.

Figure 9:
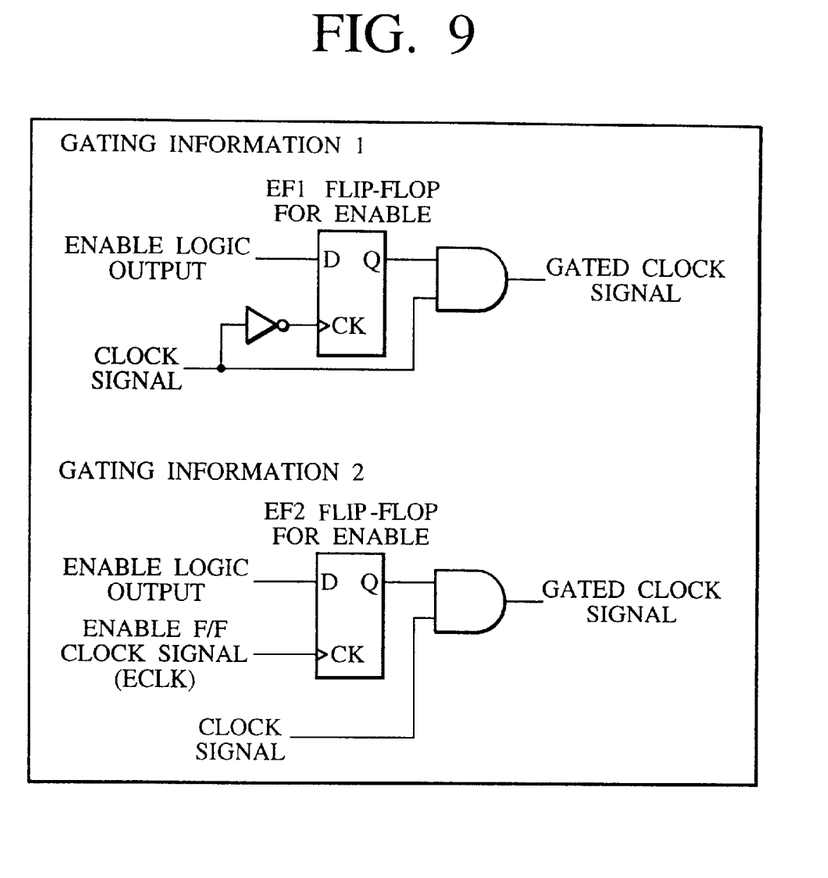
FIG. 9 is an explanatory diagram showing gating information.

The gating information input portion 3 inputs gating information, clock signal frequency and duty ratio to the control portion 5. The gating information is referred to as information in which a structure of gating circuit is described. The gating circuit of the present embodiment includes a circuit for securing a normal operation of the logic circuit when an enable logic circuit is connected to the logic circuit. For example, if the enable logic circuit is directly connected to the gating circuit comprising an AND gate, such problem may occur that irregular clock pulses are inputted to the flip-flop. However, by structuring the gating circuit in the form of a circuit containing the flip-flop or inverter as well as the AND gate as shown in FIG. 9, this problem can be solved. Meanwhile, depending on the structure of the gating circuit, the other circuit does not have to be added as shown in, for example, FIG. 15.

The circuit information storage portion 4 stores circuit information about a logic circuit to be subjected to clock gating and circuit information about the logic circuit clock-gated.

The control portion 5 controls the operation of the respective portions according to an algorithm shown in a flow chart described later in order to execute clock gating for a given logic circuit.

The enable logic timing determination portion 6 calculates a delay time of enable logic based on virtual wiring delay information to determine whether or not that delay time satisfies the timing constraint, that is, whether or not a delay time from enable logic input to enable logic output is smaller than a delay time from clock rise to an edge of clock rise or clock fall. The virtual wiring delay information mentioned here refers to calculation information for use in estimating a delay of a logic circuit after the layout is completed.

The enable logic timing constraint generating portion 7 calculates timing constraint to be given to enable logic inputted to the control portion 5 by clock signal frequency and duty ratio.

The clock gating execution portion 8 adds gating circuit and enable logic circuit to a logic circuit stored in the circuit information storage portion 4 based on enable logic and gating information inputted to the control portion 5 to generate a clock-gated logic circuit. Circuit information about a newly generated logic circuit is described in a net list.

The clock line gate information portion 9 generates information about gate existing on a clock line in the form of clock line gate information. The clock line gate information refers to a list in which clock signal, gate circuit name, flip-flop name of each clock line are described.

Figure 4:
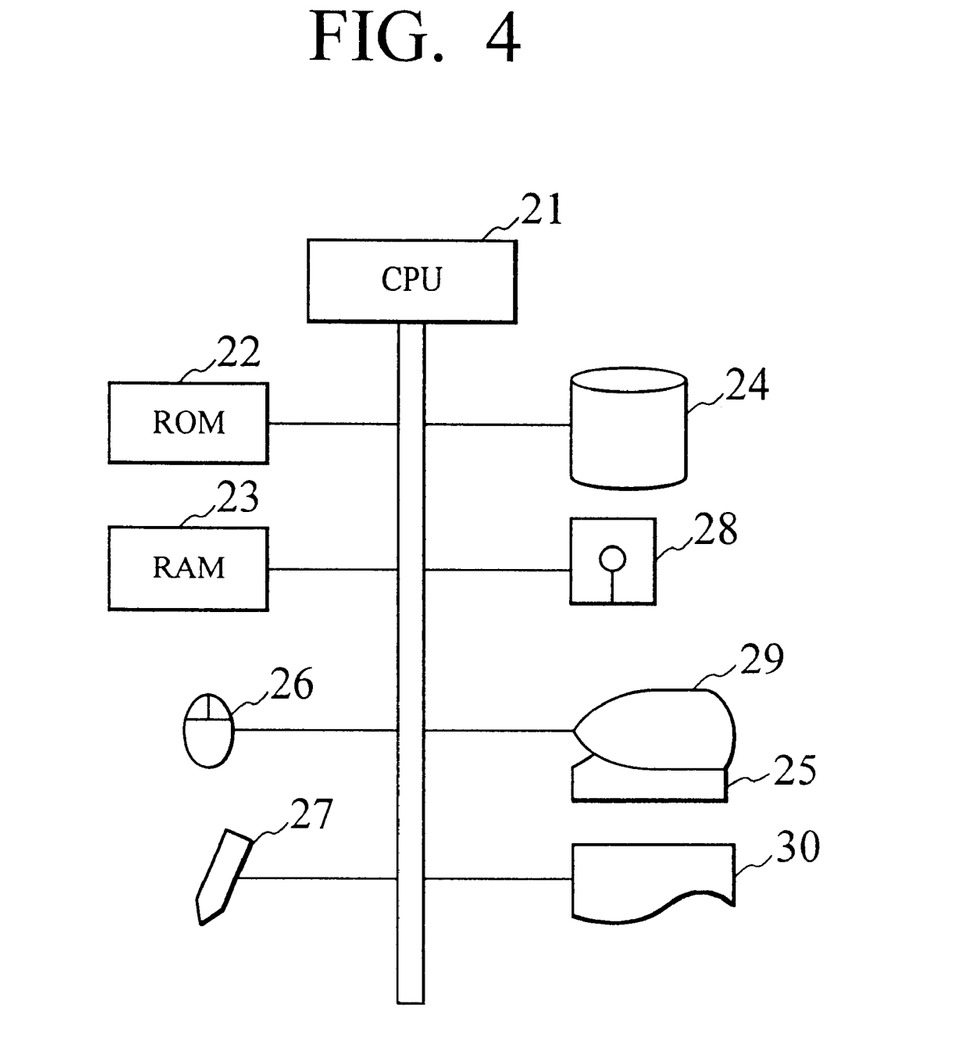
FIG. 4 is a schematic structure diagram of a computer system to which the gated clock design supporting system is applied.

The gated clock design supporting system 10 having the above described components is applied to a computer system shown in FIG. 4. This computer system includes CPU 21, ROM 22, RAM 23, magnetic disk unit 24, key board 25, mouse 26, write pen 27, flexible disk unit 28, display unit 29, and printer 30. In the same Figure, respective interface units are omitted. Here, typically circuit information about the logic circuit subjected to clock gating, enable logic and gating information are inputted through the key board 25. Further, they can be inputted through the flexible disk unit 28. The circuit information about a logic circuit subjected to clock gating can be also displayed on the display unit 29 through the mouse 26 and write pen 27 and then inputted. The circuit information about a clock-gated logic circuit is outputted to the display unit 29 and printer 30. Typically, the circuit information storage portion 4 in FIG. 3 corresponds to the magnetic disk unit 24.

Figure 5:
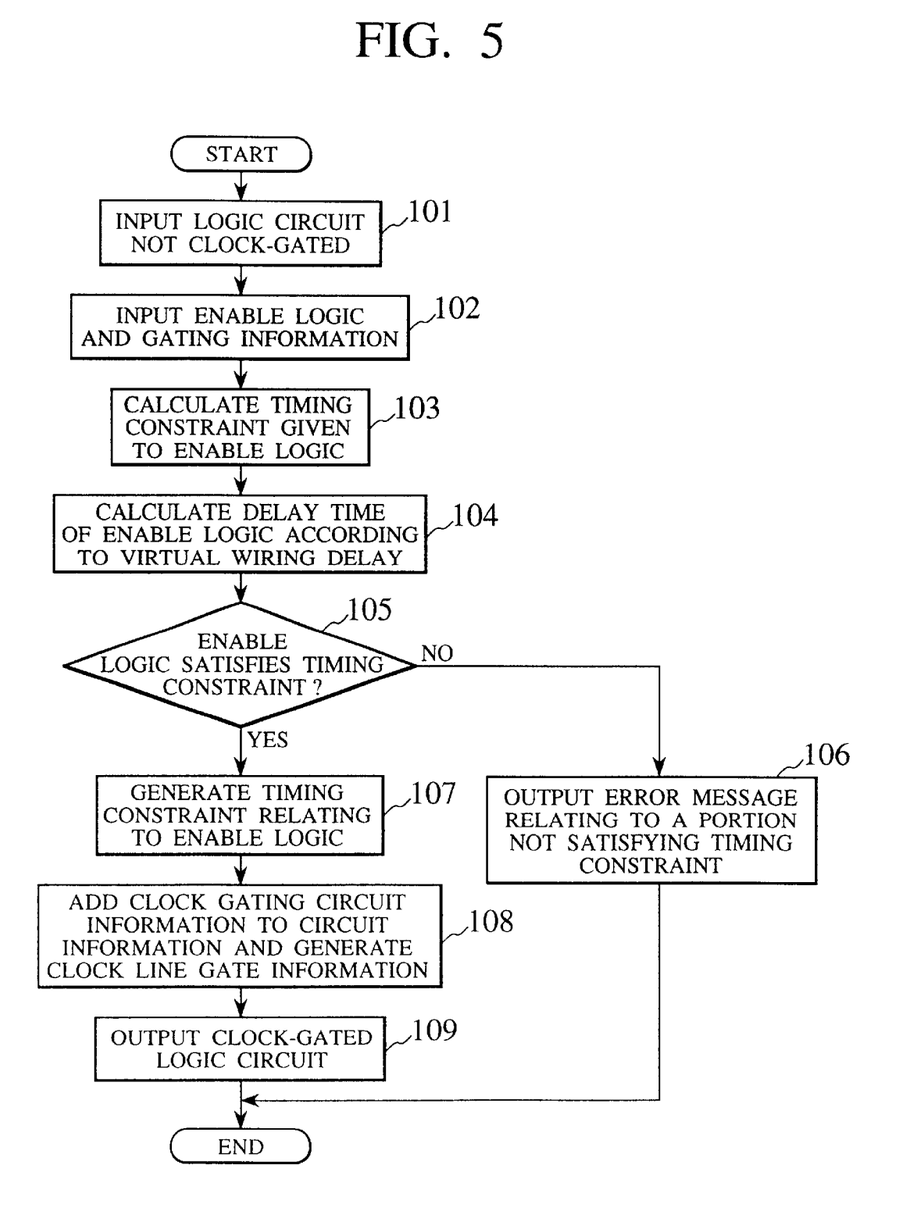
FIG. 5 is a flow chart showing steps of procedure of clock gating by the gated clock design supporting system.

Next, a processing procedure of clock gating in the gated clock design supporting system having the structure shown in FIG. 3 will be described with reference to a flow chart shown in FIG. 5. In a subsequent description, any circuit connected to the logic circuit for clock gating is generally called clock gating circuit.

Figure 6:
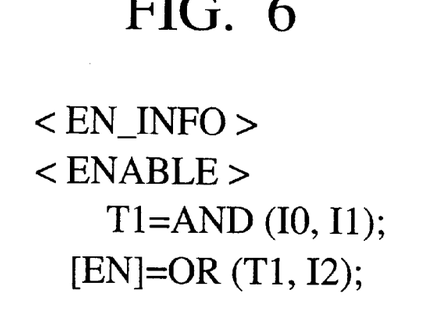
FIG. 6 shows an example of enable logic to be inputted.

First, circuit information about a logic circuit not clock-gated is inputted through the circuit information I/O portion 1 and stored in the circuit information storage portion 4 (step 101). Next, enable logic is inputted to the control portion 5 from the enable logic input portion 2 for clock gating together with the name of a flip-flop subjected to this logic. At the same time, gating information, clock signal frequency and duty ratio are inputted to the control portion 5 from the gating information input portion 3 (step 102). An example of the enable logic to be inputted is shown in FIG. 6.

Then, the control portion 5 calls the enable logic timing constraint generating portion 7, which obtains timing constraint to be secured for the enable logic inputted at step 102 according to clock signal frequency and duty ratio (step 103). Subsequently, the control portion 5 calls the enable logic timing determination portion 6 and then the enable logic timing determination portion 6 calculates a delay time of the enable logic according to virtual wiring delay and at the same time, determines whether or not that calculated enable logic delay time satisfies the timing constraint (steps 104, 105).

If it is determined that the timing constraint is not satisfied, the control portion 5 outputs an error message saying that a timing constraint error has occurred relating to an enable logic portion which does not satisfy the timing constraint, and terminates the processing (step 106). That is, an error message is displayed, for example, on the display unit 29. If it is determined that the timing constraint is satisfied, the control portion 5 calls the enable logic timing constraint generating portion 7, so that the enable logic timing constraint generating portion 7 generates timing constraint relating to the enable logic (step 107). The timing constraint generated here is used for realizing a layout satisfying the timing constraint in an automatic layout tool for logic elements. Next, the control portion 5 calls the clock gating execution portion 8 and the clock gating execution portion 8 adds information about clock gating circuit including enable logic circuit and gating circuit to circuit information stored in the circuit information storage portion 4 according to the enable logic and gating information inputted at step 102. Further, the control portion 5 calls the clock line gate information generating portion 9, and then the clock line gate information generating portion 9 generates information about the gate in which the generated clock signal and enable signal are inputted, in the form of the clock line gate information (step 108). The clock line gate information generated here is used for carrying out clock wiring without clock skew in automatic layout tool for the logic elements. Next, the control portion 5 fetches circuit information about the clock-gated logic circuit and timing constraint about enable logic, stored in the circuit information storage portion 4 and outputs them through the circuit information I/O portion 1 (step 109). That is, they are displayed on the display unit 29. Further, they can be printed through the printer 30.

Next, a concrete example of the aforementioned clock gating will be described and the operation of each component shown in FIG. 3 will be described in detail.

First, an example in which the gating circuit is formed of a circuit including an AND gate will be described.

Figure 7:
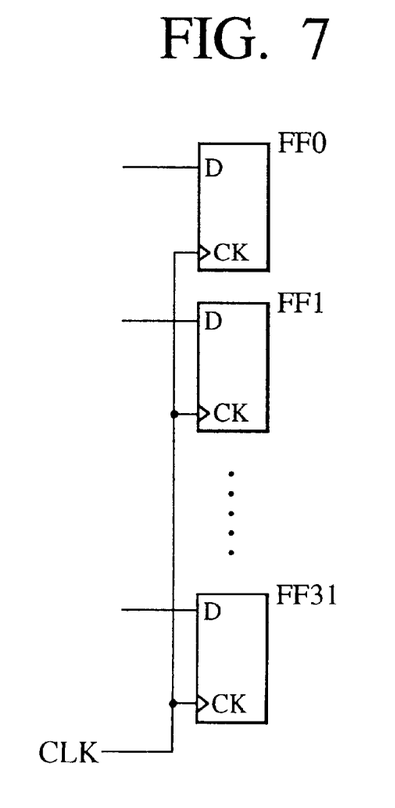
FIG. 7 is a circuit diagram showing an example of a logic circuit not clock-gated.

Assume that a logic circuit having a partial circuit shown in FIG. 7 is inputted through the circuit information I/O portion 1. In FIG. 7, FF0, FF1, . . . FF31 indicate flip-flops and signal CLK indicates clock signal. In each flip-flop, D port indicates data input port and CK port indicates clock input port.

Figure 10:
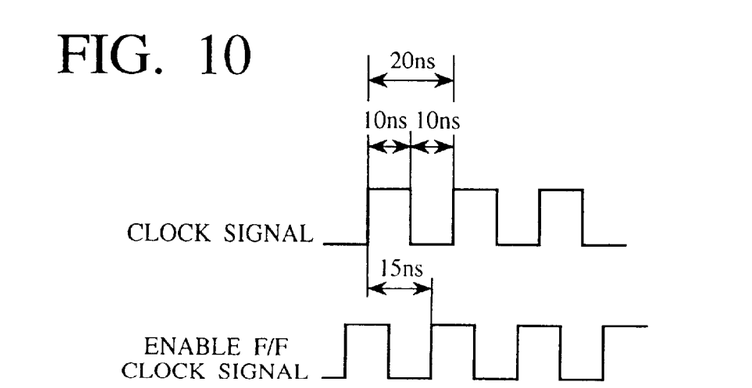
FIG. 10 is a timing chart showing operation of clock signal.

Assume that, for the flip-flops FF0, FF1, . . . FF31, enable logic information shown in FIG. 8 and gating information shown in FIG. 9 are inputted respectively from the enable logic input portion 2 and gating information input portion 3 to the circuit information storage portion 4. At the same time, assume that information saying that the clock signal cycle is 20 ns (nanosecond) and duty ratio is 50% is supplied from the gating information input portion 3 as shown by a timing chart of FIG. 10.

Figure 8:
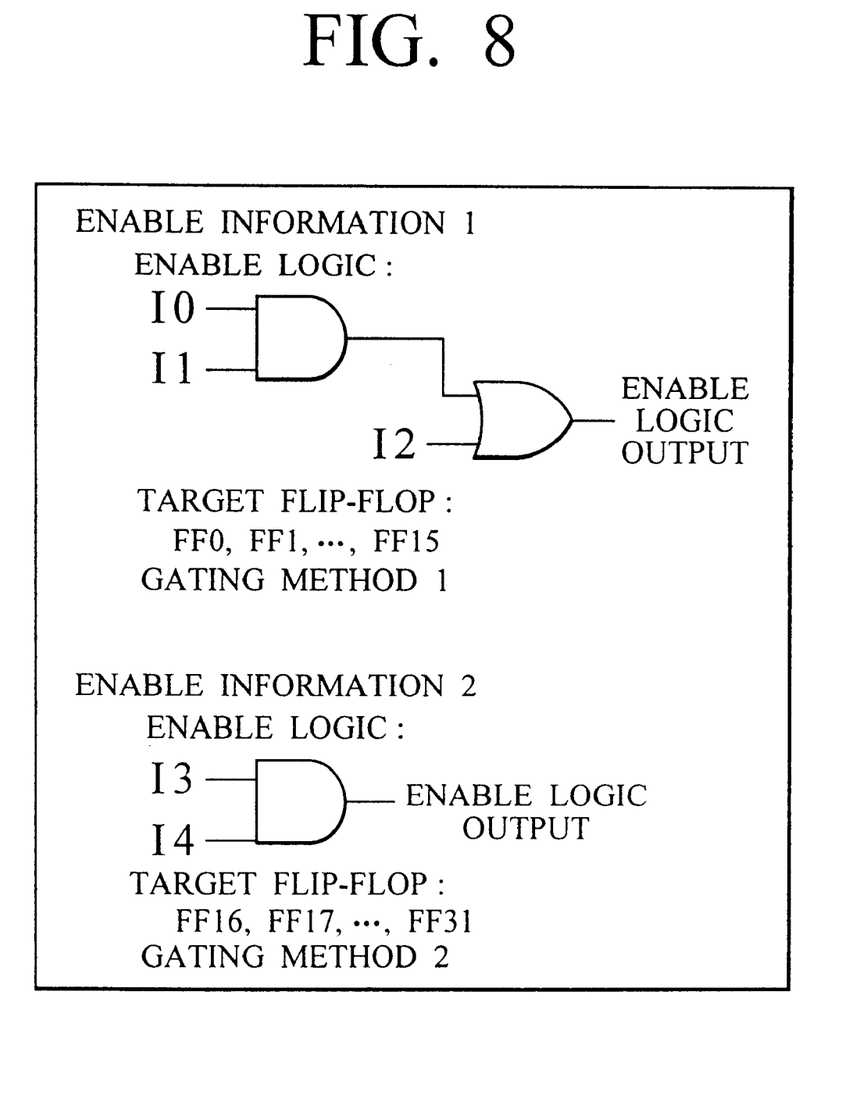
FIG. 8 is an explanatory diagram showing information about enable logic.

Then, the enable logic timing constraint generating portion 7 introduces timing constraint to be secured for the enable logic shown in FIG. 8 according to gating information shown in FIG. 9.

For example, in the case of the gating information 1, clock input of the enable flip-flop (EF1) is inverted by the inverter circuit. Thus, enable logic output must be fixed until the clock signal falls. That is, enable logic of the enable information 1 is secured with timing constraint of 10 ns.

In the case of gating information 2 shown in FIG. 9, assuming that enable F/F clock signal (ECLK) is the same as clock signal in terms of frequency and duty ratio and phase difference is 15 ns, because clock input to the enable flip-flop (EF2) is a signal having a phase difference of 15 ns relative to the clock signal, the enable logic of the enable information 2 shown in FIG. 8 is secured with timing constraint of 15 ns.

Figure 11:
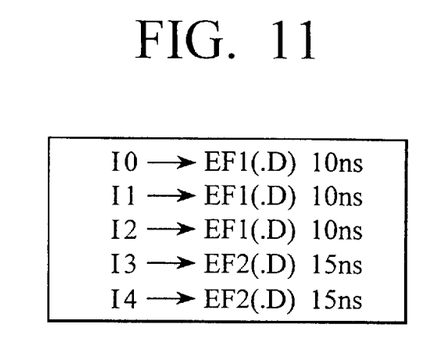
FIG. 11 is an explanatory diagram showing an example of timing constraint relating to enable logic.

The enable logic timing determination portion 6 calculates a delay time of the enable logic according to virtual wiring delay and then determines whether or not the enable logic satisfies the timing constraint. In this case, it is assumed that it is satisfied. Here, the enable logic timing generating portion 7 generates timing constraint about the enable logic as shown in FIG. 11. Meanwhile, the timing constraint generated here is outputted as a final result.

Figure 12:
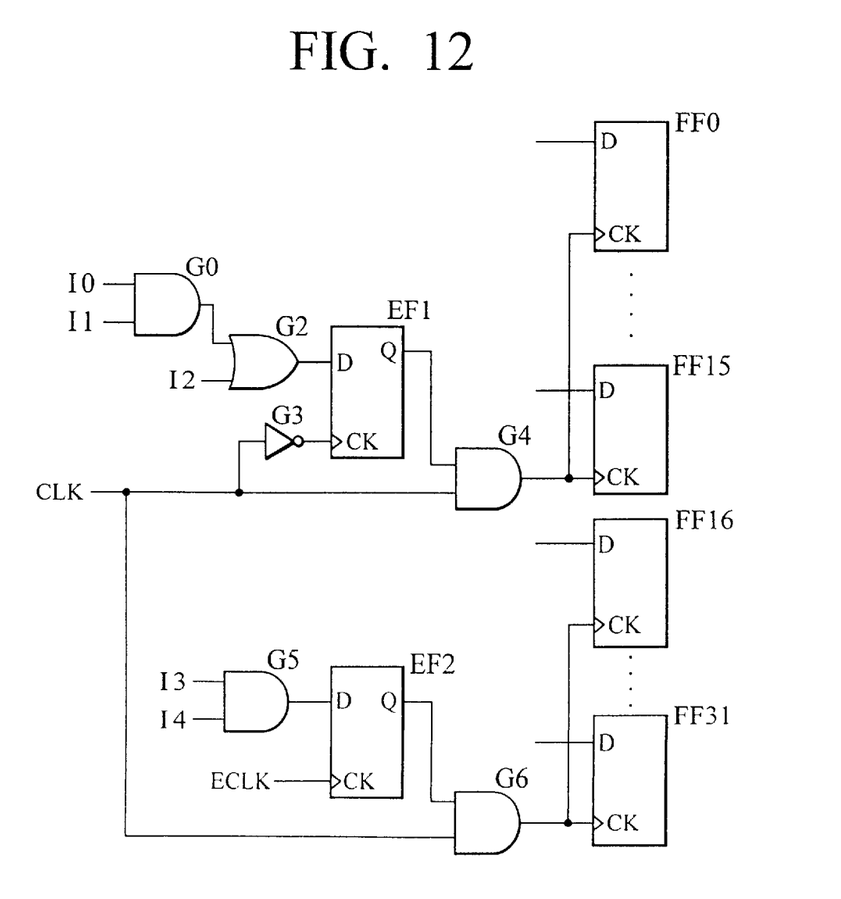
FIG. 12 is a circuit diagram showing a clock gated logic circuit.
Figure 13:
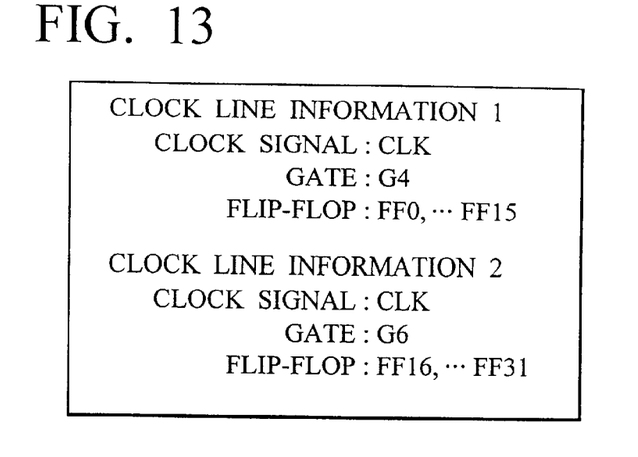
FIG. 13 is an explanatory diagram showing an example of clock line gate information.

Then, the clock gating execution portion 8 adds the enable logic circuit and gating circuit to the circuit information shown in FIG. 8 stored in the circuit information storage portion 4 according to the enable logic shown in FIG. 8 and gating information shown in FIG. 9 so as to produce circuit information about a logic circuit shown in FIG. 12. Further, the clock line gate information generating portion 9 generates information about a gate which inputs the generated clock signal and enable signal, in the form of clock line gate information as shown in FIG. 13.

The circuit information about the clock-gated logic circuit, timing constraint about the enable logic and clock line gate information, thus generated, are outputted through the circuit information I/O portion 1. That is, they are outputted to, for example, the display unit 29 or printer 30.

Next, as another specific example, a case in which the gating circuit is formed of OR gate will be described.

Assume that the logic circuit having a partial circuit shown in FIG. 7 is inputted through the circuit information I/O portion 1. Here, assume that, for the flip-flops FF0, FF1, . . . FF31, the information about enable logic shown in FIG. 14 and gating information shown in FIG. 15 are inputted respectively from the enable logic input portion 2 and gating information input portion 3 to the circuit information storage portion 4. Further, assume that as shown by a timing chart of FIG. 10, information saying that clock signal cycle is 20 ns and duty ratio is 50% is supplied through the gating information input portion 3.

Figure 14:
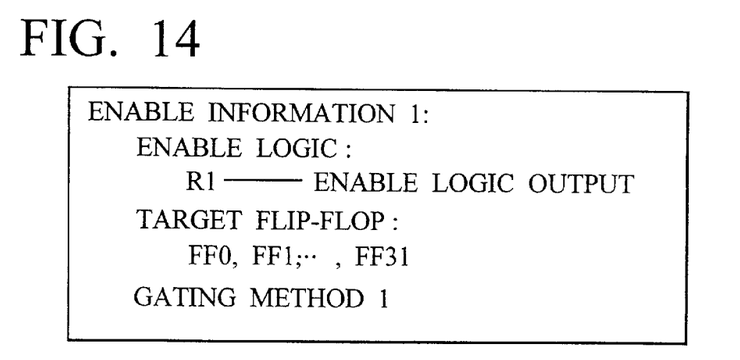
FIG. 14 is an explanatory diagram showing information about enable logic.
Figure 15:
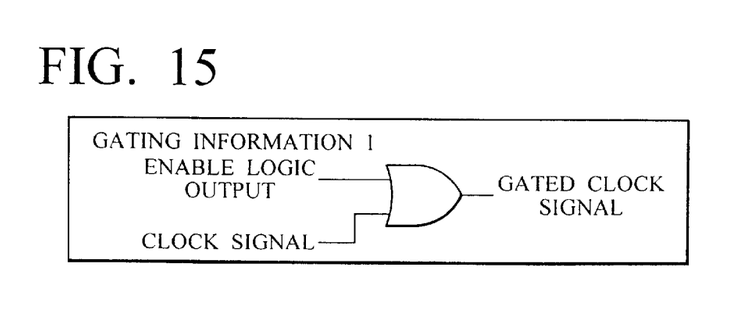
FIG. 15 is an explanatory diagram showing gating information.

Then, the enable logic timing constraint generating portion 7 introduces timing constraint to be secured for the enable logic shown in FIG. 14 according to the gating information shown in FIG. 15. In the case of gating information 1 shown in FIG. 15, the enable logic output must be fixed until the clock signal falls. That is, the enable logic of the enable information 1 of FIG. 14 is secured with the timing constraint of 10 ns.

Figure 16:
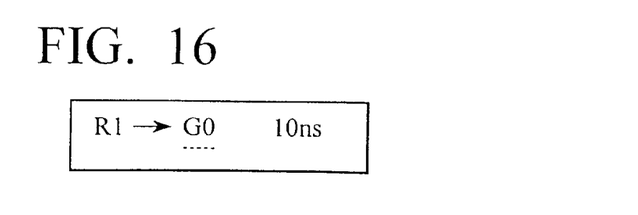
FIG. 16 is an explanatory diagram showing an example of timing constraint relating to enable logic.
Figure 17:
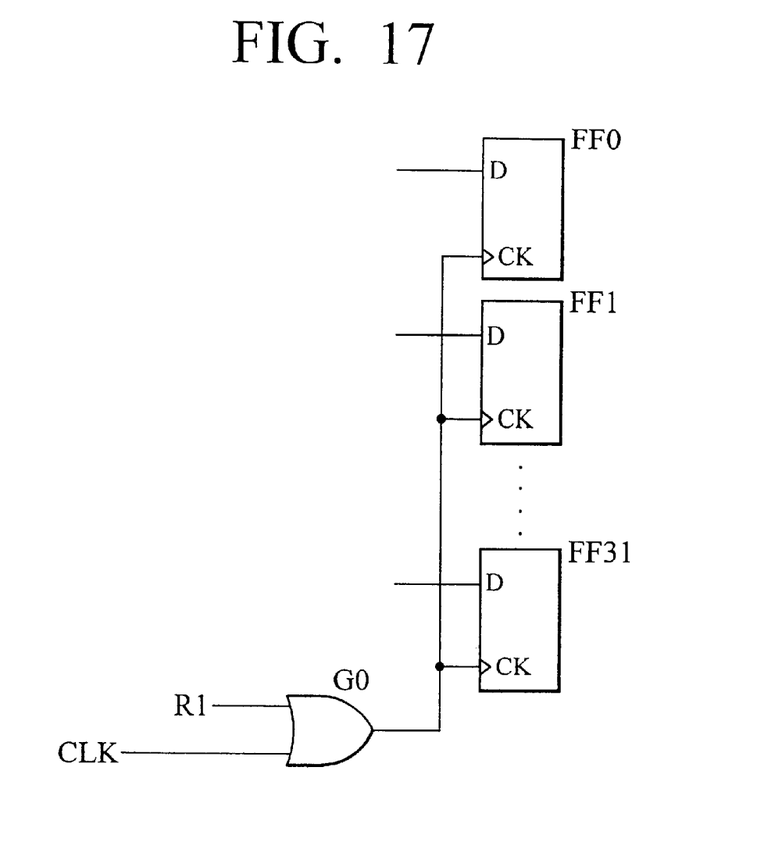
FIG. 17 is a circuit diagram showing a clock-gated logic circuit.
Figure 18:
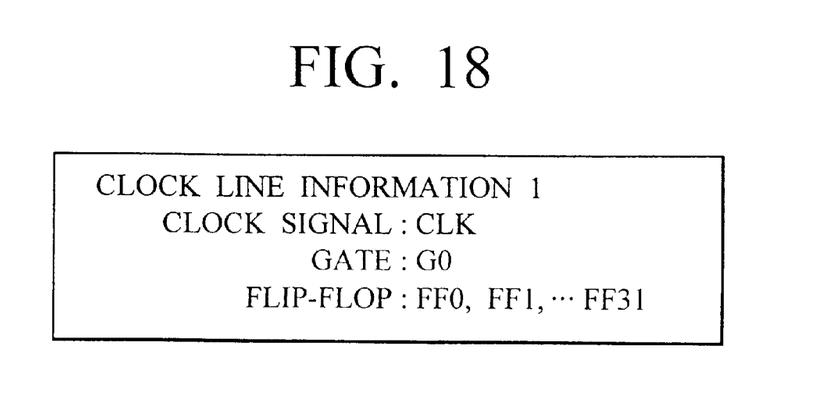
FIG. 18 is an explanatory diagram showing an example of clock line gate information.

Next, the enable logic timing determination portion 6 calculates a delay time of the enable logic according to virtual wiring delay so as to determine whether or not the delay time of the enable logic satisfies the timing constraint. In this case, it is assumed that it is satisfied. Here, the enable logic timing constraint generating portion 7 generates the timing constraint relating to the enable logic shown in FIG. 16. Then, the clock gating execution portion 8 adds the enable logic circuit and gating circuit to circuit information shown in FIG. 7 stored in the circuit information storage portion 4 according to the enable logic shown in FIG. 14 and gating information shown in FIG. 15 so as to generate circuit information about logic circuit shown in FIG. 17. The clock line gate information generating portion 9 generates clock line gate information shown in FIG. 18. The generated circuit information is outputted through the circuit information I/O portion 1. That is, it is outputted to the display unit 29 or printer 30.

As described above, according to the gated clock design supporting system of the present embodiment, by inputting the logic circuit not clock-gated as shown in FIG. 7, information about enable logic as shown in FIG. 8 (14), and gating information as shown in FIG. 9 (15), logic circuit clock-gated as shown in FIG. 12 (17), timing constraint relating to the enable logic as shown in FIG. 11 (16) and clock line gate information as shown in FIG. 13 (17) can be generated and then outputted.

Therefore, unlike conventional art, a designer does not have to carry out manually addition and correction about description of the enable logic circuit in a net list, so that design time can be reduced. Further, because there is no possibility that human correction error may occur, he is released from repeating the same work, so that time wasted in design work can be eliminated. Further, because the designer does not have to produce a complicated timing constraint to be given to design supporting CAD, reductions of design time and load on the designer are achieved. As explained here, the gated clock design supporting system according to the present embodiment is capable of automating various procedures of the gated clock design, so that a large reduction of design period can be attained.

Meanwhile, a program for achieving operation of the above described gated clock design supporting system can be stored in a computer readable memory. By reading that program from the memory by computer and executing the program to control the computer, the above gated clock design supporting system can be achieved. The memory mentioned here includes all recording mediums capable of recording the program, such as a memory device, a magnetic disk, a optical disk and the like.

It should be understood that many modifications and adaptations of the invention will become apparent to those skilled in the art and it is intended to encompass such obvious modifications and changes in the scope of the claims appended hereto.

What is claimed is:

1. A gated clock design supporting method comprising the steps of:

inputting information about a logic circuit not a clock-gated, information about enable logic for controlling clock output and information about a gating circuit;

generating a timing constraint to be secured for said enable logic;

calculating a delay time in said enable logic;

determining whether or not said enable logic satisfies said timing constraint based on said delay time;

when said enable logic satisfies said timing constraint, adding said gating circuit and a circuit composed of said enable logic to said logic circuit not clock-gated so as to generate a clock-gated logic circuit; and outputting information about said clock-gated logic circuit and said timing constraint to be secured for said enable logic.

2. A gated clock design supporting method according to claim 1, wherein said gating circuit includes a circuit for securing a normal operation for the logic circuit.

3. A gated clock design supporting method according to claim 1, further comprising the step of:

generating information about a gate a clock line of said clock-gated logic circuit.

4. A gated clock design supporting method according to claim 1, further comprising the step of outputting, when said enable logic does not satisfy the timing constraint, an error message indicating that a timing constraint error has occurred relating to an enable logic portion which does not satisfy said timing constraint.

5. A gated clock design supporting method according to claim 1, wherein information about said clock-gated logic circuit and said timing constraint to be secured for said enable logic are displayed on a display unit.

6. A gated clock design supporting method according to claim 1, wherein information about said logic circuit not clock-gated, information about said enable logic and information about said gating circuit are inputted in the form of text information through a key board.

7. A gated clock design supporting method according to claim 1, wherein information about said logic circuit not clock-gated is inputted by drawing on a screen of a display unit.

8. A gated clock design supporting apparatus comprising:
   a circuit information input portion for inputting information about a logic circuit not clock-gated, information about enable logic for controlling a clock output and information about a gating circuit;
   an enable logic timing constraint generating portion for generating a timing constraint to be secured for said enable logic;
   an enable logic timing determination portion for calculating a delay time in said enable logic and determining whether or not said enable logic satisfies said timing constraint based on said delay time;
   a clock gating execution portion for, when said enable logic satisfies said timing constraint, adding said gating circuit and a circuit composed of said enable logic to said logic circuit not clock-gated so as to generate a clock-gated logic circuit; and
   a circuit information output portion for outputting information about said clock-gated logic circuit and said timing constraint to be secured for said enable logic.

9. A gated clock design supporting apparatus according to claim 8, wherein said gating circuit includes a circuit for securing a normal operation for the logic circuit.

10. A gated clock design supporting apparatus according to claim 8, further comprising:
    a clock line gate information generating portion for generating information about a gate on a clock line of said clock-gated logic circuit.

11. A gated clock design supporting apparatus according to claim 8, wherein when said enable logic timing determination portion determines that said enable logic does not satisfy the timing constraint, said circuit information output portion outputs an error message indicating that a timing constraint error has occurred relating to an enable logic portion which does not satisfy said timing constraint.

12. A gated clock design supporting apparatus according to claim 8, wherein said circuit information input portion comprises a key board.

13. A gated clock design supporting apparatus according to claim 8, wherein said circuit information input portion comprises a display unit and information about said logic circuit not clock-gated is inputted by drawing on a screen of said display unit.

14. A computer-readable memory storing gated clock design supporting program, said gated clock design supporting program comprising the steps of:

inputting information about a logic circuit not clock-gated, information about enable logic for controlling a clock output and information about a gating circuit;

generating a timing constraint to be secured for said enable logic;

calculating a delay time in said enable logic;

determining whether or not said enable logic satisfies said timing constraint based on said delay time;

when said enable logic satisfies said timing constraint, adding said gating circuit and a circuit composed of said enable logic to said logic circuit not clock-gated so as to generate a clock-gated logic circuit; and outputting information about said clock-gated logic circuit and said timing constraint to be secured for said enable logic.

15. A computer-readable memory storing gated clock design supporting program according to claim 14, wherein said gating circuit includes a circuit for securing a normal operation for the logic circuit.

16. A computer-readable memory storing gated clock design supporting program according to claim 14, further comprising the step of:
    generating information about a gate on a clock line of said clock-gated logic circuit.

17. A computer-readable memory storing gated clock design supporting program according to claim 14, further comprising the step of:
    when said determining step determines that said enable logic does not satisfy the timing constraint, outputting an error message indicating that a timing constraint error has occurred relating to an enable logic portion which does not satisfy said timing constraint.

18. A computer-readable memory storing gated clock design supporting program according to claim 14, wherein at said outputting step, information about said logic circuit clock-gated and said timing constraint to be secured for said enable logic are displayed on a display unit.

19. A computer-readable memory storing gated clock design supporting program according to claim 14, where at said inputting step, information about said logic circuit not clock-gated, information about said enable logic and information about said gating circuit are inputted in the form of text information through a key board.

20. A computer-readable memory storing gated clock design supporting program according to claim 14, where at said inputting step, information about said logic circuit not clock-gated is inputted by drawing on a screen of a display unit.

* * * * *